United States Patent
Cho

[11] Patent Number: 6,141,280
[45] Date of Patent: Oct. 31, 2000

[54] REFRESH PERIOD AUTOMATIC DETECTING DEVICE FOR SEMICONDUCTOR MEMORY DEVICE, METHOD OF AUTOMATICALLY DETECTING REFRESH PERIOD, AND REFRESH PERIOD OUTPUT DEVICE

[75] Inventor: Kyu Seok Cho, Kyoungki-do, Rep. of Korea

[73] Assignee: Hyundai Electronics Industries Co., Ltd., Kyoungki-do, Rep. of Korea

[21] Appl. No.: 09/474,128

[22] Filed: Dec. 29, 1999

[30] Foreign Application Priority Data

Dec. 30, 1997 [KR] Rep. of Korea ............ 98-61957

[51] Int. Cl.[7] ................................. G11C 7/00
[52] U.S. Cl. ............ 365/222; 365/226; 365/189.07
[58] Field of Search .................. 365/222, 201, 365/189.07, 226

[56] References Cited

U.S. PATENT DOCUMENTS

| | | | |
|---|---|---|---|
| 4,542,454 | 9/1985 | Brcich et al. ........... | 365/222 X |
| 4,694,454 | 9/1987 | Matsuura ................ | 371/13 |
| 5,299,168 | 3/1994 | Kang .................... | 365/222 |
| 5,566,121 | 10/1996 | Hadderman et al. ....... | 365/222 |
| 5,875,143 | 2/1999 | Ben-Zvi ................. | 365/222 |

*Primary Examiner*—Huan Hoang
*Attorney, Agent, or Firm*—Nath & Associates; Gary M. Nath; Harold L. Novick

[57] ABSTRACT

A refresh period automatic detecting device for a semiconductor memory device including a power-up detector unit detecting power applied from a system; a control unit producing a read/write timing control signal for internal data and at least one control signal to control the overall components of the device in response to an output signal of the power-up detector unit; an internal data generator unit producing internal data in response to the control signal; a comparator unit comparing the internal data with internal data stored in a cell; and a refresh circuit unit determining and storing a refresh period from the time relationship between the read/write timing control signal by the control signal of the control unit if the two data do not correspond to each other.

10 Claims, 4 Drawing Sheets

REFRESH PERIOD AUTOMATIC DETECTING DEVICE FOR SEMICONDUCTOR MEMORY DEVICE, METHOD OF AUTOMATICALLY DETECTING REFRESH PERIOD, AND REFRESH PERIOD OUTPUT DEVICE

BACKGROUND OF THE INVENTION

1. Field of the Invention

The present invention relates to a semiconductor memory device. More particularly, it relates to a refresh period detecting device for a semiconductor device that can automatically detect the refresh period according to system environments and a method of detecting the refresh period of the semiconductor memory device and a refresh period output device.

2. Description of the Prior Art

Generally, a dynamic random access memory (DRAM) uses a capacitor as a unit storage device into which data is written, and this is a cell. When writing data of 1 (or high) into the cell, a high voltage is applied thereto while a low voltage is applied thereto when writing data of 0 (or low) into the cell. It is preferable that the charge of a capacitor should be constant unless the voltage of its connecting terminal is changed. However, actually, the leakage current problem is caused as time goes by, and it cannot tell whether the stored data is 1 or 0. Accordingly, in order to maintain the storage data, the data stored in the cell must be periodically sensed and amplified, and then restored in that cell, which is referred to as refresh. Refresh for DRAM has several performance methods: RAS (row address strobe) only refresh and CAS before RAS refresh. In RAS only refresh, a row address strobe (/RAS) signal and a row address for performing refresh are applied to raise the voltage of a word line selected by the row address, and after data stored in all the cells connected to this word line is amplified by a sense amplifier and rewritten, the voltage of the word line then falls, which forms a single refresh cycle. According to this refresh, it is inconvenient to input all the corresponding row addresses from the outside in order to refresh all the cells of DRAMs.

CBR refresh (CAS before RAS refresh or auto-refresh) can solve this inconvenience. This CBR refresh is similar to RAS only refresh in the internal performance of sensing-amplification-restoring, and corresponding row addresses are internally generated in order without inputting row addresses from the outside. Accordingly, a user of DRAM does not have to memorize and input row addresses needing refresh. There is also a hidden refresh similar to CBR refresh. According to this hidden refresh, a refresh is performed in hiding as if it seems that refresh is not performed when viewed from the outside while column address strobe (/CAS) signal is active, /RAS signal is toggled, thus performing CBR refresh.

In a system using DRAM, DRAM just waits without doing anything in case that there is no need to use DRAM for a given period of time. In this case, refresh is required. Even if any command is input from the outside, time is calculated in DRAM to perform refresh in a required period of time, which is self-refresh.

Such refresh should be performed before the leakage current occurs to make it impossible to discriminate data, and this is a refresh period. Refresh is essential for DRAM but increases power consumption and interrupts the normal operation, which is not good for a user.

Therefore, much research and development are devoted to an increase in the refresh period in which the data can be maintained in the cell. A standard of the operating time in performing refresh of DRAM for a system is a refresh interval. The refresh interval is a value obtained by dividing the refresh period by the member of refresh cycle (the number of RAS cycle) for refresh the overall cells. The refresh interval is the maximum time interval by which a user gives a refresh command to refresh the DRAM.

As the refresh interval of DRAM 15.6 $\mu$sec has been standardized since 2 msec/128 cycle (the number obtained by dividing the refresh period of 2 msec by 128 cycles, about 15.6 $\mu$sec) was used in 16K-bit DRAM. The time interval of 7.8 $\mu$sec becomes standardized in 256M-bit DRAM. A system using DRAM performs refresh once every minimum refresh intervals to prevent data from decaying. It is very important for DRAM to make the refresh period, the minimum value of time for refreshing all the cells, long. This time is closely related to the data retention time, a period of time for which data is stored in a cell and is not damaged. A principal cause of decaying data stored in a cell is the leakage current problem. This leakage current flows through a p-n junction or channel of a transistor (referred to as a cell transistor or an access transistor), serving as a switching device connecting the cell data storage terminal with a bit line. Such a current varies with the operating voltage and temperature, and is particularly changed by two times in response to a 10-degree variation of the operating temperature. The data retention time of DRAM significantly varies with the temperature and operating voltage. The refresh period is determined by data retention time under the worst operating condition in order to prevent data from decaying under the worst condition wherein DRAM operates. However, refresh is performed even though the data is safely kept in an actual system that does not use DRAM under the worst condition all the time, thus increasing the power consumption and a period of the time for which the DRAM does not perform its normal operation.

Manufacturing DRAMs of various standards by controlling the refresh period in response to the various system operating environment causes disadvantageous efficiency aspect of mass production and mass sale of DRAMs. There was a conventional technique of changing the refresh period by sensing the temperature and operating the refresh, taking the great variation of the leakage current with the temperature into consideration. However, it is difficult to exactly detect the temperature through a conventional DRAM process, and the temperature resolution is significantly decreased because of the variation in the process and problems in the circuitry thereby hardly expecting a satisfactory result.

SUMMARY OF THE INVENTION

An object of the present invention is to provide a refresh period automatic detecting device for a semiconductor memory device which can automatically detect a refresh period.

Another object of the present invention is to provide a method of automatically self-detecting by a DRAM and performing refresh.

Still another object of the present invention is to provide a refresh period output device which can output a refresh period, detected by a refresh period automatic detecting device, to the outside through an external address.

Additional features and advantages of the invention will be set forth in the description which follows, and in part will be apparent from the description, or may be learned by practice of the invention. The objects and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a refresh period automatic detecting device for a semiconductor memory device including a power-up detector unit detecting power applied from a system; a control unit producing a read/write timing control signal for internal data and at least one control signal to control the overall components of the device in response to an output signal of the power-up detector unit; an internal data generator unit producing internal data in response to the control signal; a comparator unit comparing the internal data with internal data stored in a cell; and a refresh circuit unit determining and storing a refresh period from the time relationship between the read/write timing control signal by the control signal of the control unit if the two data do not correspond to each other.

According to another aspect of the present invention, a method of automatically detecting a refresh period for a semiconductor memory device includes the steps of detecting power applied from a system; producing a read/write timing control signal for internal data and at least one control signal in response to an output detecting signal; storing internal data, produced in response to the control signal, in a cell; reading the data out of the cell in response to the control signal; comparing the data read out of the cell with data previously stored in the cell in response to the control signal; and if the two data do not correspond to each other, determining a time interval between the data reading and writing steps as data retention time, and storing this time interval as the refresh period.

According to still another aspect of the present invention, a refresh period external output device includes a detector unit detecting a test mode in response to a given address signal applied from the outside; a refresh test control unit actuated by a detecting signal of the detector unit, and producing plural control signals for refresh test; a refresh circuit unit producing a signal in response to the refresh period stored in the refresh circuit unit in response to one of the control signals; a data output control unit controlling data output in response to one of the control signals; and a data output circuit unit producing a signal in response to the refresh period by a control signal of the data output control unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF PREFERRED EMBODIMENT

Reference will now be made in detail to the preferred embodiments of the present invention, examples of which are illustrated in the accompanying drawings.

Figure 1:
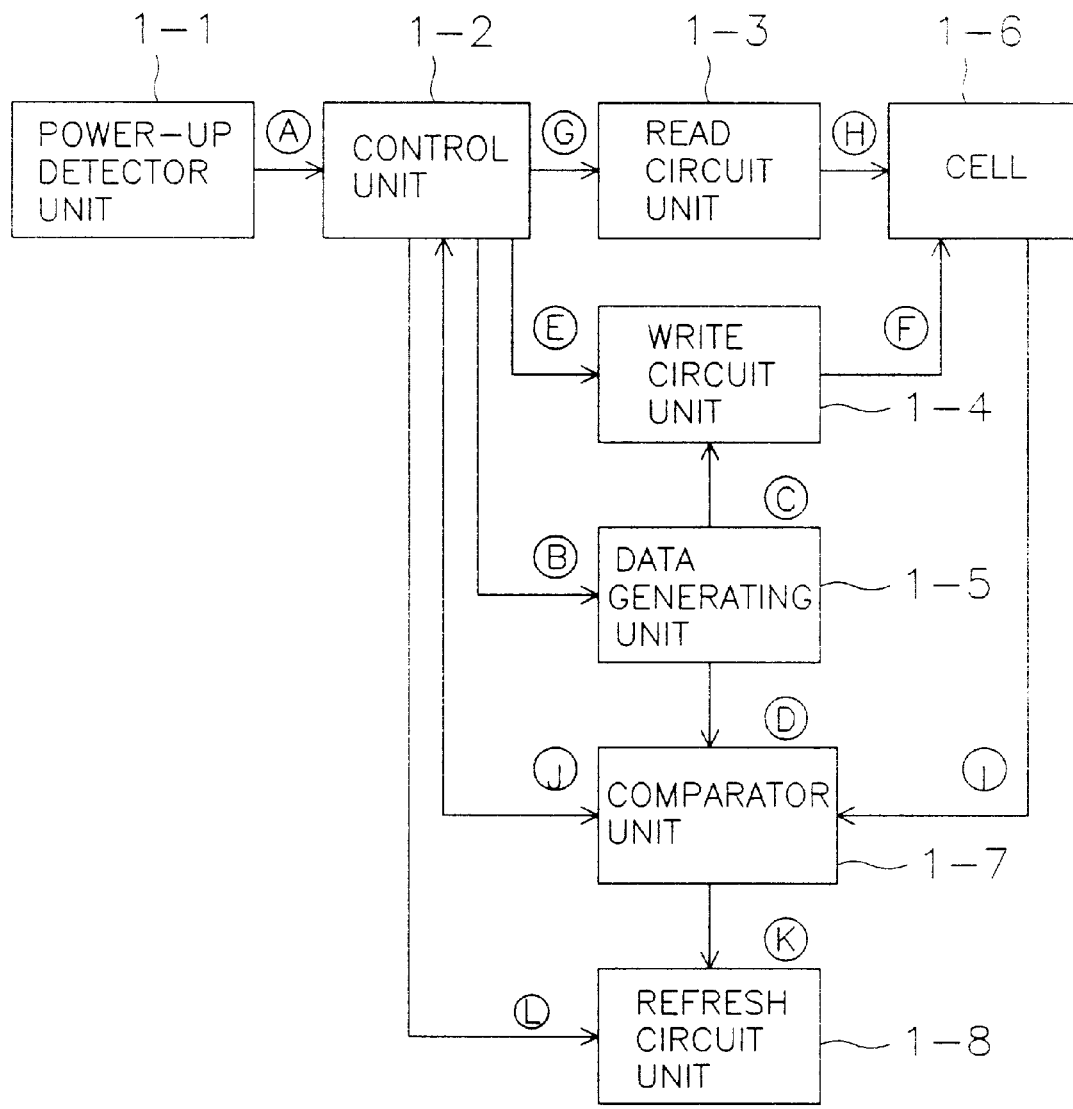
FIG. 1 is a block diagram of a refresh period automatic detecting device for a semiconductor memory device in accordance with the present invention in accordance with the present invention.

FIG. 1 is a block diagram of a refresh period automatic detecting device for a semiconductor memory device in accordance with the present invention. As shown in FIG. 1, each of most electronic devices including DRAMs has a circuit for sensing application of power to its system and initializing its internal circuit, and such a circuit is referred to as a power-up detector circuit.

Reference numeral 1-1 designates a power-up detector unit detecting power applied to the system. According to the present invention, since the refresh period should be determined prior to the actual operation and the inventive system should start operation as soon as power is applied to DRAM, a power-up output signal is needed.

Reference numeral 1-2 designates a control unit producing plural control signals for automatically controlling the refresh period in response to the output signal of the power-up detector unit 1-1.

Reference numeral 1-3 designates a read circuit unit producing a control signal for reading data out of a cell 1-6 in response to the output signal of the control unit 1-2.

Reference numeral 1-4 designates a write circuit unit producing a control signal for writing data into cell 1-6 in response to the output signal of the control unit 1-2.

Reference numeral 1-5 designates a data generator unit outputting an internal data signal used for detecting the refresh period to write circuit unit 1-4 and a comparator unit 1-7 in response to the output signal of the control unit 1-2.

Reference numeral 1-7 designates a comparator unit comparing the output signal of the data generator unit 1-5 with the data signal from cell 1-6, thus producing a comparison signal.

Reference numeral 1-8 designates a refresh circuit unit that determines the refresh period in response to an output signal of each of control unit 1-2 and comparator unit 1-7.

The inventive system further includes a clock generator unit (not shown) operating in response to the output signal of the control unit 1-2, and a timer (not shown) operating in response to the output signal of the control unit 1-2.

Figure 2:
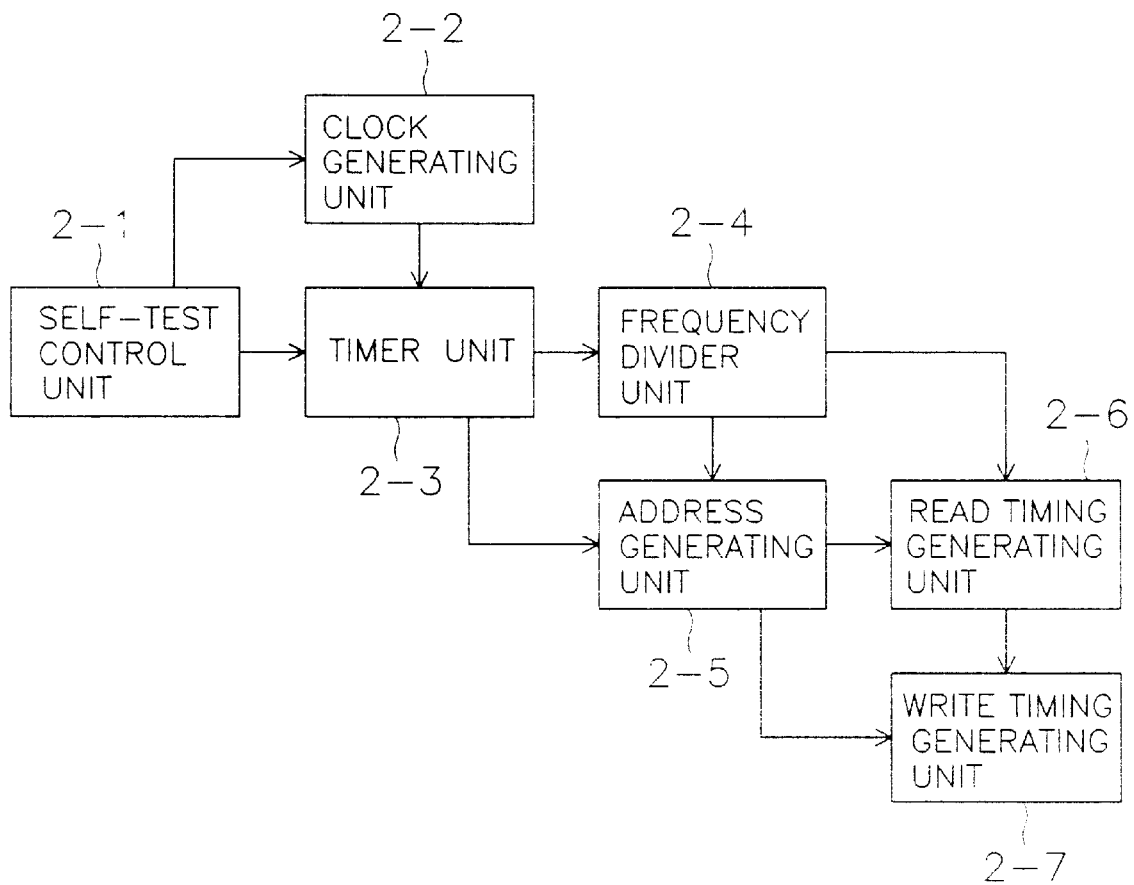
FIG. 2 is a block diagram of the control unit of FIG. 2.

FIG. 2 is the block diagram of the control unit of FIG. 1. As shown in FIG. 2, reference numeral 2-1 designates a self-test control unit, a kind of a state machine operating clock generator unit 2-2 and a timer 2-3 in response to the power-up signal in order to detect the refresh period.

Reference numeral 2-2 is a clock generating unit which forms a square wave pulse train of a given cycle by using an oscillator.

Reference numeral 2-4 designates a frequency divider unit. This frequency divider unit 2-4 generates a desired frequency using the square wave pulse train from clock generator unit 2-2 as a clock signal, and produces internal column/row addresses used for detecting the refresh period.

Reference numeral 2-5 designates an address generating unit producing an internal signal that is used for read/write operation by using frequency divider unit 2-4 at an appropriate point in response to the control signal of a timer unit 2-3.

Reference numeral 2-6 designates a read timing generating unit producing an internal signal used for read operation at an appropriate point in response to the output signals of the frequency divider unit 2-4 and address generating unit 2-5.

Reference numeral 2-7 designates a write timing generating unit producing an internal signal used for write operation at an appropriate point in response to the output signals of the read timing generating unit 2-6 and address generating unit 2-5.

The operation of the refresh period automatic detecting system for the inventive semiconductor memory (FIG. 1) is fully described as follows.

A. First, control unit 1-2 begins to automatically detect the refresh period in response to the output signal, i.e, power-up signal, of the power-up detector unit 1-1.

B. Data generating unit 1-5 produces internal data used for detection of the refresh period in response to the output signal of the control unit 1-2. High or low-level data can control its voltage, which will be described in another preferred embodiment, and in this embodiment it is assumed that high-level data and low-level one respectively correspond to a power supply voltage and ground. C and D. The data of the data generating unit 1-5 is input to write circuit unit 1-4 used in a conventional DRAM and stored in comparator unit 1-7 at the same time in order to compare its result.

E and F. Write circuit unit 1-4 stores data applied from data generator unit 1-5 in cell 1-6 as conventional write operation in response to the control signal of the control unit 1-2. Write circuit unit 1-4 uses a circuit employed for the normal DRAM operation and uses data internally produced and addresses produced from control unit 1-2 for detecting the refresh period.

G and H. As control unit 1-2 stands by for a given period of time by timer 1-2 and then outputs a control signal, read circuit unit 1-3 produces the control signal to cell 1-6 and performs the read operation. Read circuit unit 1-3 uses a conventional DRAM.

I. Data stored in cell 1-6 by read operation is sensed and amplified, and is not produced at normal data output. This data read out is produced to comparator unit 1-7.

J. Control unit 1-2 sends its control signal to comparator unit 1-7 and compares the internally produced data applied from data generating unit 1-5 and stored in advance with data held in the cell and read out. If two data correspond to one another, control unit 1-2 controls frequency divider unit 2-4 and timer unit 2-3 to produce a new read/write signal set, and repeats the above procedure from the C step.

The new read/write signal set has the longer standby time than the previous signals.

The data retention time is determined from the time relationship between read and write control signals if the data does not correspond to each other.

K. The refresh period is stored in the refresh control circuit on the basis of the data retention time determined in the J step, and refresh is performed according to this value.

The present invention includes a test mode added to the refresh period detecting control circuit to inform of a detected appropriate refresh period from the outside of DRAM.

There are plural combination signals not used among signals into which the input signals are combined in the DRAM specification, and a part of combination signals not permitted to a DRAM user, illegal commands, an input condition under which an output may be different from a normal result to find the state or operation of the internal circuit of the DRAM for being used to the product development.

If a refresh period is detected and can be found from the outside as one of the product test methods, this can be greatly advantageous to design the DRAM circuit and develop a memory device. This can detect a result closer to the actual one rather than to detect a data retention time of a conventional DRAM.

Figure 3:
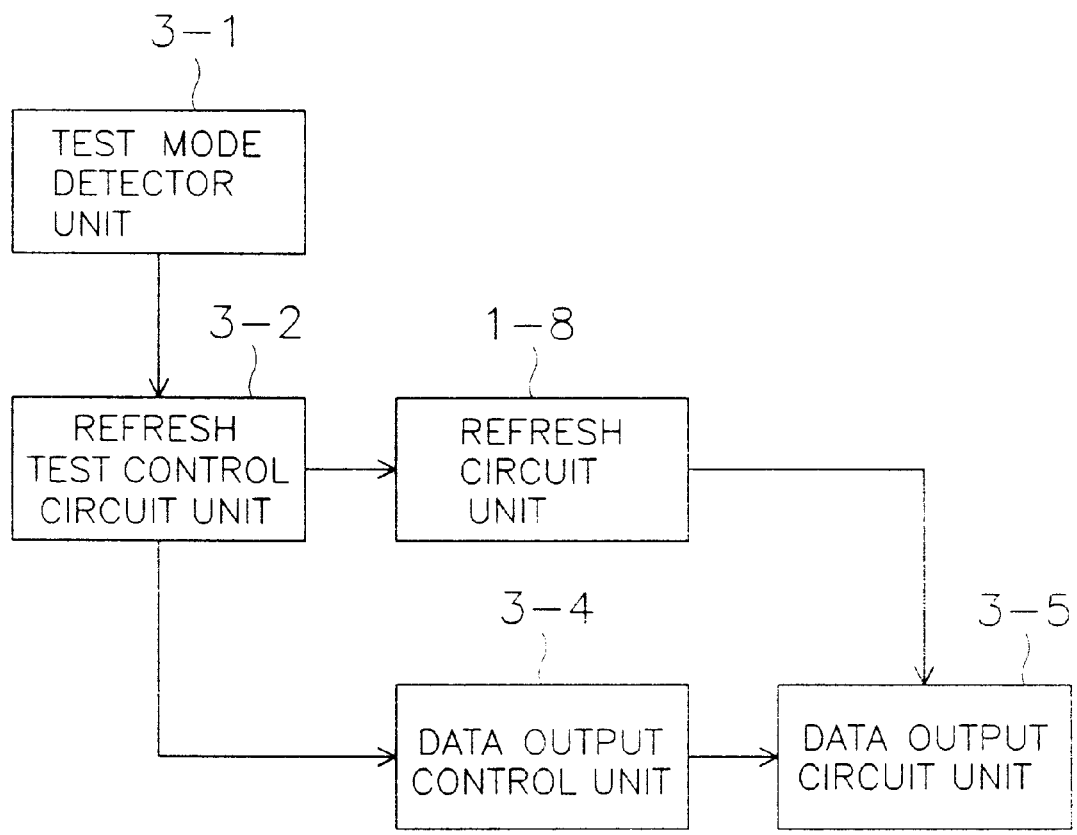
FIG. 3 is a block diagram of a refresh period external output device for a semiconductor memory device in accordance with the present invention.

FIG. 3 is a block diagram of the refresh period external output device for a semiconductor memory device in accordance with the present invention. A synchronous DRAM (SDRAM) will be described by way of an example in this preferred embodiment.

As a method of setting an operating mode SDRAM has a mode register to store the information about various operating modes (burst length, column address strobe latency (CAS latency), address increasing method (progressive increase and interlaced increase), etc. In order to do this, seven bits of 0 address to 6th address are used, and regulations that put functions suitable for the object of a DRAM manufacturer are standardized for another addresses.

The inventive device enters a test mode by using a certain address more than the 7th address according to the regulations, and a test mode detector 3-1 of FIG. 3 operates refresh test control circuit unit 3-2 to produce a signal to the outside through data output circuit unit 3-5 in response to data output control unit 3-4 according to the detected refresh period stored in refresh circuit unit 1-8.

As another preferred embodiment of the present invention, it is possible to use different voltage levels while the high- and low-level data are power supply voltage and ground voltage, respectively.

If the above operation is performed by using the voltage lower than the power supply voltage as high-level data, the data is rapidly decayed and the refresh period can be rapidly detected. Likewise, in case of low-level data, the voltage higher than the ground is used to make the detection of refresh period faster.

Figure 4:
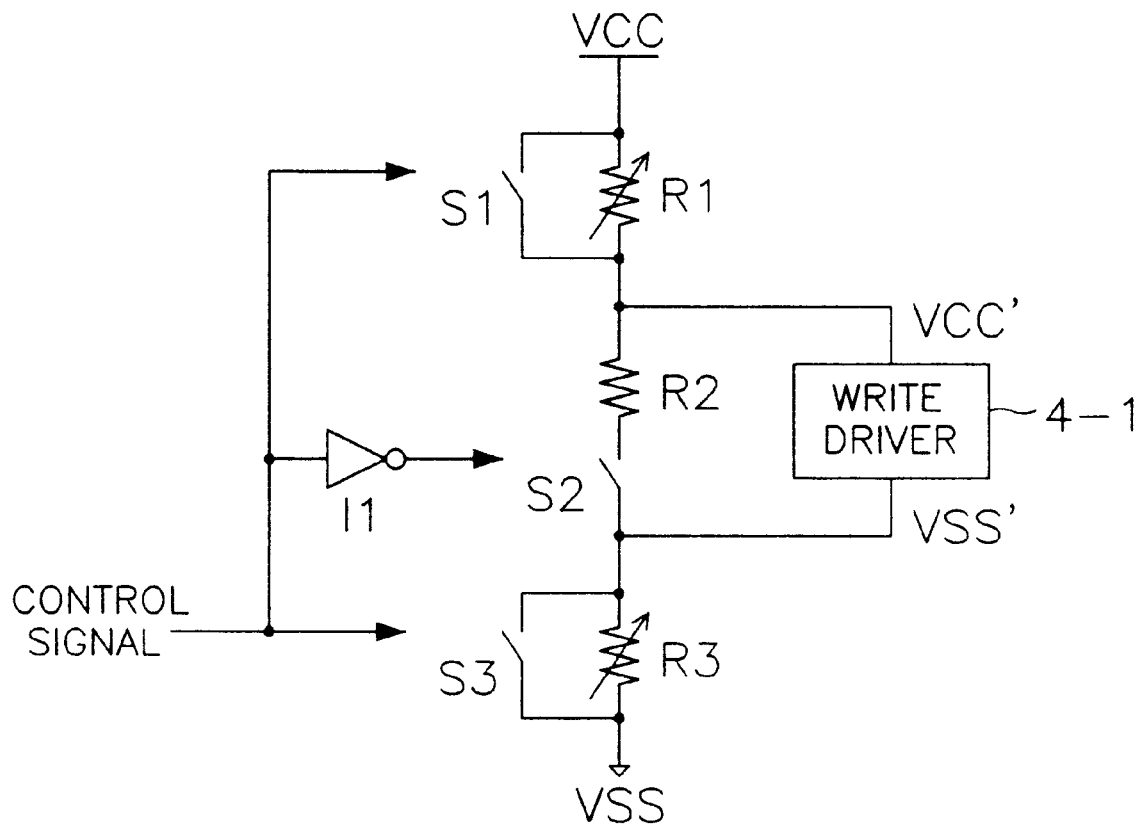
FIG. 4 depicts a construction view in part according to an another embodiment of the data generating unit of FIG. 1 that can vary the voltage level of data.

FIG. 4 depicts a construction view in part according to an another embodiment of the data generating unit of FIG. 1 that can vary the voltage level of data.

The Data generating unit 1-5 includes a variable resistor R1 having one end connected to a power line Vcc; a resistor R2 serially connected to other end of the variable resistor R1; a variable resistor R3 serially connected to resistor R2; a switch S1 having both terminals connected to one end of variable resistor R1 and the other end, respectively; a switch S2 interposed between resistor R2 and variable resistor R3; a write driver 4-1 having one end connected between switch S1 and one end of the resistor R2, and the other end connected between the other end of the switch S2 and one end of the resistor R3; and a switch S3 having both terminals each connected to one end and the other end of the resistor R3.

Switches S1 and S3 are turned on by control signal of the control unit 1-2 during operation to find the refresh period, and after detecting the refresh period, the control singal of the control unit 1-2 is input as an inverted signal through an inverter I1, thus turning switch S2 off. The data voltage level can be changed to Vcc' and Vss' by varying the resistance of variable resistors R1 and R3. The operation will now be described.

When finding the refresh period, a refresh time measure control signal is applied so that switches S1 and S3 are turned on and switch S2 is turned off in response to the control signal of the control unit 1-2, and power supply voltage Vcc' of a write driver 4-1 becomes lower than the overall power supply voltage of DRAM by the level divided to resistor R1 and resistors R2+R3.

In addition, ground Vss' of the write driver 4-1 becomes higher than the overall ground Vss of DRAM by the level divided to resistor R3 and resistors R1+R2.

After detecting the refresh period, the refresh period detecting control circuit produces a control signal so as to turn on switches S1 and S3 and turn off switch S2, and power supply voltage Vcc' of the write driver 4-1 is the same as the overall power supply voltage Vcc of DRAM. Likewise, the ground voltage Vss' of the write driver is the same as the overall ground voltage Vss of DRAM, thus providing perfect data during read/write operation to a cell.

Variable resistors R1 and R2 of FIG. 4 are used to exactly supply a desired data level in the write driver by controlling their resistances, and can be realized by an active resistor using a metal oxide semiconductor (MOS) transistor. Respective switches S1, S2 and S3 can be formed of a metal oxide semiconductor switch.

As described above, the present invention can detect automatically the refresh period to be suitable for the system environment in which DRAM is used instead of the refresh period determined as a single value in the manufacturing step, thus increasing the ratio of time for reading data out of DRAM and writing data thereinto, and enabling to design more efficient system.

As the refresh period becomes long, the power minimally consumed (the power consumed when the system continuously maintains the held data without read/write operation) is reduced so that a portable system such as a notebook computer can have increased battery life. According to the present invention, since the maximum value of the refresh time can be self detected while DRAM is actually mounted, and be taken out from the outside through a test command, those who design and develop DRAM circuits can determine the exact refresh period appropriate for the system kind and environment.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A refresh period automatic detecting device for a semiconductor memory device comprising:

power-up detecting means for detecting power applied from a system;

control means for producing a read/write timing control signal for internal data and at least one control signal to control overall components of the device in response to an output signal of the power-up detecting means;

internal data generating means for producing internal data in response to the control signal;

comparator means for comparing the internal data with internal data stored in a cell; and refresh circuit means for determining and storing a refresh period from the time relationship between the read/write timing control signal by the control signal of the control means if the two data do not correspond to each other.

2. A refresh period automatic detecting device for a semiconductor memory device according to claim 1, wherein the control means includes:

self-test control means for producing control signal in response to the output signal of the power-up detecting means; clock generating means for producing clock signal in response to a control signal of the self-test control means;

timer means for counting and outputting the clock signal in response to a control signal of the self-test control means;

frequency dividing means for dividing the frequency of the clock signal through the timer means;

address generating means for generating an internal column/row address by tuning an output signal of the frequency dividing means to the output signal of the timer means;

read timing generating means producing a signal for reading out data in response to an output signal of each of the frequency dividing means and the address generating means; and write timing generating means receiving the output signal of each of the frequency dividing means and the address generating means.

3. A refresh period automatic detecting system for a semiconductor memory device according to claim 1, wherein the internal data generating means produces high-level data lower than the power supply voltage of the system, and low-level data higher than the ground voltage of the system.

4. A refresh period automatic detecting system for a semiconductor memory device according to claim 1, wherein the internal data generating means produces high-level data, which is the same as the power supply voltage of the system, and low-level data, which is the same as the ground voltage of the system.

5. A refresh period automatic detecting system for a semiconductor memory device according to claim 3, wherein the data generating means includes:

a first resistor having one end connected to a power line;

a second resistor serially connected to the other end of the first resistor;

a third resistor serially connected to the second resistor;

a first switch having both terminals connected to one and other ends of the first resistor, respectively;

a second switch interposed between the second and third resistors;

write driving means having one end connected between the first switch and one end of the second resistor, and the other end connected between the other end of the second switch and one end of the third resistor; and a third switch having both terminals connected between one end of the third resistor and the other end, wherein the first and third switches are turned on by the control signal of the control means during operation to find the refresh period, and after detecting the refresh period, the control signal of the control means is input as an inverted signal through an inverter to turn the second switch off.

6. A refresh period automatic detecting device for a semiconductor memory device according to claim 5, wherein the first and third resistors are each variable resistors.

7. A refresh period automatic detecting device for a semiconductor memory device according to claim 1, wherein a refresh period external output system includes:

detecting means detecting a test mode in response to a given address signal applied from the outside;

refresh test control means actuated by a detecting signal of the detecting means, and producing plural control signals for refresh test;

a refresh circuit producing a signal in response to the refresh period stored in the refresh circuit means in response to one of the control signals;

data output control means controlling data output in response to one of the control signals; and a data output circuit producing a signal in response to the refresh period by a control signal of the data output control means.

8. A method of automatically detecting a refresh period for a semiconductor memory device comprising the steps of:

detecting power applied from a system;

producing a read/write timing control signal for internal data and at least one control signal in response to an output detecting signal;

storing internal data, produced in response to the control signal, in a cell;

reading the data out of the cell in response to the control signal;

comparing the data read out of the cell with data previously stored in the cell in response to the control signal; and if the two data do not correspond to each other, determining a time interval between the data reading and writing steps as data retention time, and storing this time interval as the refresh period.

9. A method of automatically detecting a refresh period for a semiconductor memory device according to claim 8, comprising the steps:

storing internal data if the two data correspond to each other;

reading data out of the cell; and repeating the comparing step until the two data do not correspond to each other by changing a delay time of a timer means.

10. A method of automatically detecting a refresh period for a semiconductor memory device according to claim 8, wherein the internal high-level data is produced to be lower than the power supply voltage of the system and the low-level data is produced to be higher than the ground voltage of the system by the control signal.

* * * * *